United States Patent
Gallegos et al.

(10) Patent No.: US 9,875,930 B2
(45) Date of Patent: Jan. 23, 2018

(54) METHOD OF PACKAGING A CIRCUIT

(71) Applicant: Texas Instruments Incorporated, Dallas, TX (US)

(72) Inventors: Bernardo Gallegos, McKinney, TX (US); Abram Castro, Fort Worth, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 56 days.

(21) Appl. No.: 14/582,349

(22) Filed: Dec. 24, 2014

(65) Prior Publication Data

US 2015/0111344 A1    Apr. 23, 2015

Related U.S. Application Data

(60) Division of application No. 13/563,345, filed on Jul. 31, 2012, now abandoned, which is a
(Continued)

(51) Int. Cl.
*H01L 21/768* (2006.01)
*H01L 23/31* (2006.01)
(Continued)

(52) U.S. Cl.
CPC ........ *H01L 21/76838* (2013.01); *H01L 21/56* (2013.01); *H01L 21/76801* (2013.01);
(Continued)

(58) Field of Classification Search
CPC .......... H01L 21/76838; H01L 23/3128; H01L 23/49816; H01L 23/5389; H01L 21/76801; H01L 21/56; H01L 24/19; H01L 24/20; H01L 2224/16225; H01L 2224/81815; H01L 2224/12105; H01L 2224/131; H01L 2224/16227; H01L 2224/73204; H01L 2224/81191; H01L 2924/15311;
(Continued)

(56) References Cited

U.S. PATENT DOCUMENTS 4,233,396 A * 11/1980 Armstrong ............ C08F 283/01
264/294
6,207,004 B1 * 3/2001 Murasawa ............ B32B 37/206
156/300
(Continued)

*Primary Examiner* — William F Kraig
*Assistant Examiner* — Pavel Ivanov
(74) *Attorney, Agent, or Firm* — Jacqueline J. Garner; Charles A. Brill; Frank D. Cimino

(57) ABSTRACT

Methods of packaging integrated circuits are disclosed herein. In one embodiment of a method. A die having a side is provided. A conductive stud is connected to the side of the die, wherein the conductive stud has a first end that is connected to the die and an opposite second end. The die is encapsulated except for the side. A first dielectric layer is affixed to the side of the die. The first dielectric layer has a first side and a second side. The first side of the first dielectric layer is affixed to the side of the die. The conductive stud enters the first side of the first dielectric layer. A conductive layer is affixed to the second side of the first dielectric layer. The second side of the conductive stud is affixed to the conductive layer using a conductive adhesive.

17 Claims, 6 Drawing Sheets

Related U.S. Application Data continuation-in-part of application No. 13/443,401, filed on Apr. 10, 2012, now abandoned, and a continuation-in-part of application No. 13/481,275, filed on May 25, 2012, now Pat. No. 9,142,472.

(60) Provisional application No. 61/538,365, filed on Sep. 23, 2011, provisional application No. 61/596,617, filed on Feb. 8, 2012.

(51) Int. Cl.
*H01L 23/498* (2006.01)
*H01L 23/538* (2006.01)
*H01L 21/56* (2006.01)
*H01L 23/00* (2006.01)

(52) U.S. Cl.
CPC .... *H01L 23/3128* (2013.01); *H01L 23/49816* (2013.01); *H01L 23/5389* (2013.01); *H01L 24/19* (2013.01); *H01L 24/20* (2013.01); H01L 24/16 (2013.01); H01L 2224/12105 (2013.01); H01L 2224/131 (2013.01); H01L 2224/13082 (2013.01); H01L 2224/13147 (2013.01); H01L 2224/16225 (2013.01); H01L 2224/16227 (2013.01); H01L 2224/73204 (2013.01); H01L 2224/81191 (2013.01); H01L 2224/81815 (2013.01); H01L 2224/83192 (2013.01); H01L 2224/9202 (2013.01); H01L 2924/15311 (2013.01)

(58) Field of Classification Search
CPC ........... H01L 2224/83192; H01L 24/16; H01L 2224/13082; H01L 2224/9202
USPC .................................................. 438/106–127
See application file for complete search history.

(56) References Cited

U.S. PATENT DOCUMENTS

| | | | | |
|---|---|---|---|---|
| 2002/0025602 | A1* | 2/2002 | Jiang | H01L 21/563 438/108 |
| 2002/0093108 | A1* | 7/2002 | Grigorov | H01L 21/563 257/781 |
| 2002/0103303 | A1* | 8/2002 | Kodemura | C08F 8/00 525/262 |
| 2005/0186390 | A1* | 8/2005 | Bersuch | B29C 65/562 428/119 |
| 2005/0205951 | A1* | 9/2005 | Eskridge | B81B 7/007 257/416 |
| 2005/0224967 | A1* | 10/2005 | Brandenburg | H01L 23/293 257/737 |
| 2007/0262436 | A1* | 11/2007 | Kweon | H01L 21/561 257/686 |
| 2009/0162975 | A1* | 6/2009 | Honer | H01L 23/13 438/113 |
| 2010/0248428 | A1* | 9/2010 | Yoshida | H01L 24/03 438/118 |
| 2011/0204513 | A1* | 8/2011 | Meyer | H01L 24/96 257/738 |
| 2012/0077312 | A1* | 3/2012 | Lee | H01L 21/563 438/108 |

* cited by examiner

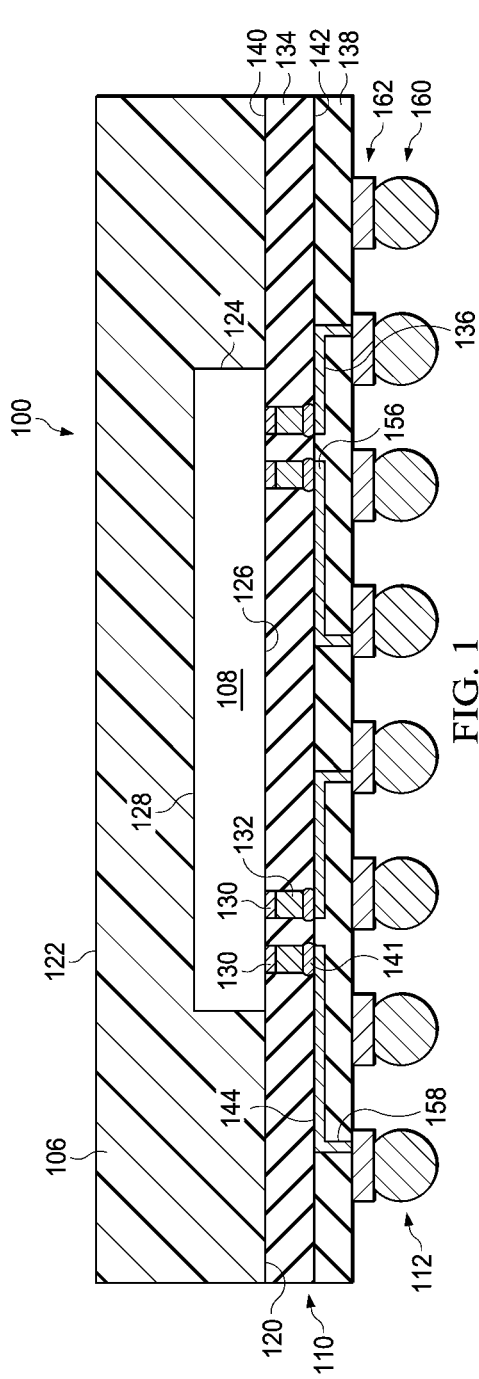
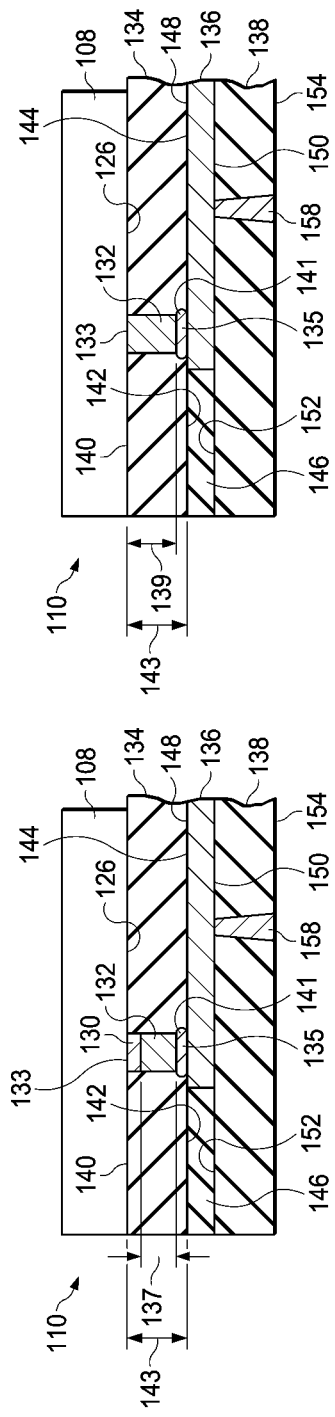

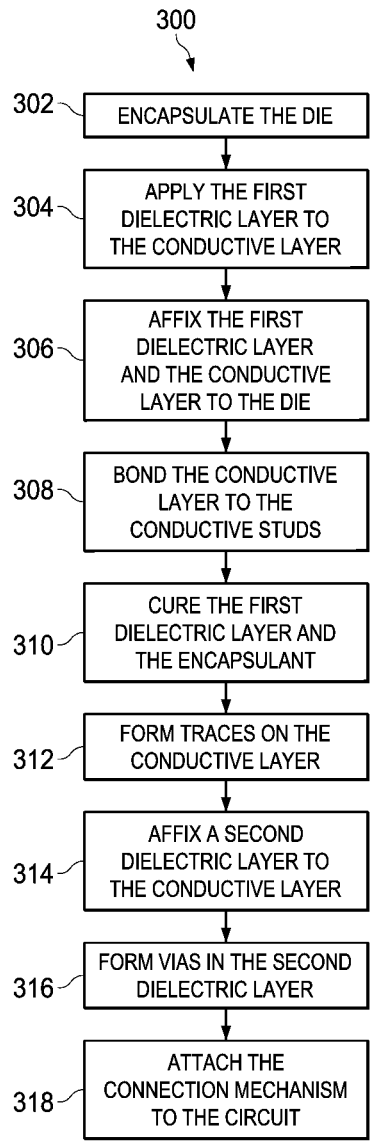
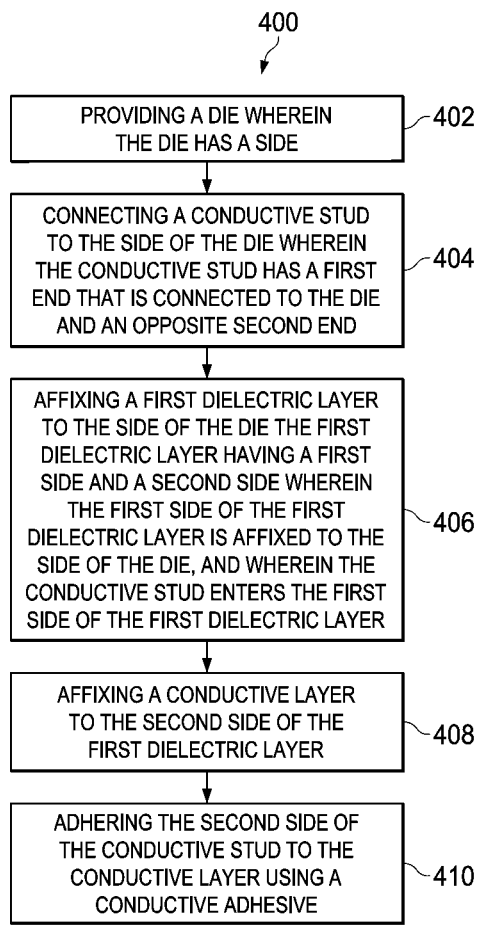
FIG. 4
FIG. 13

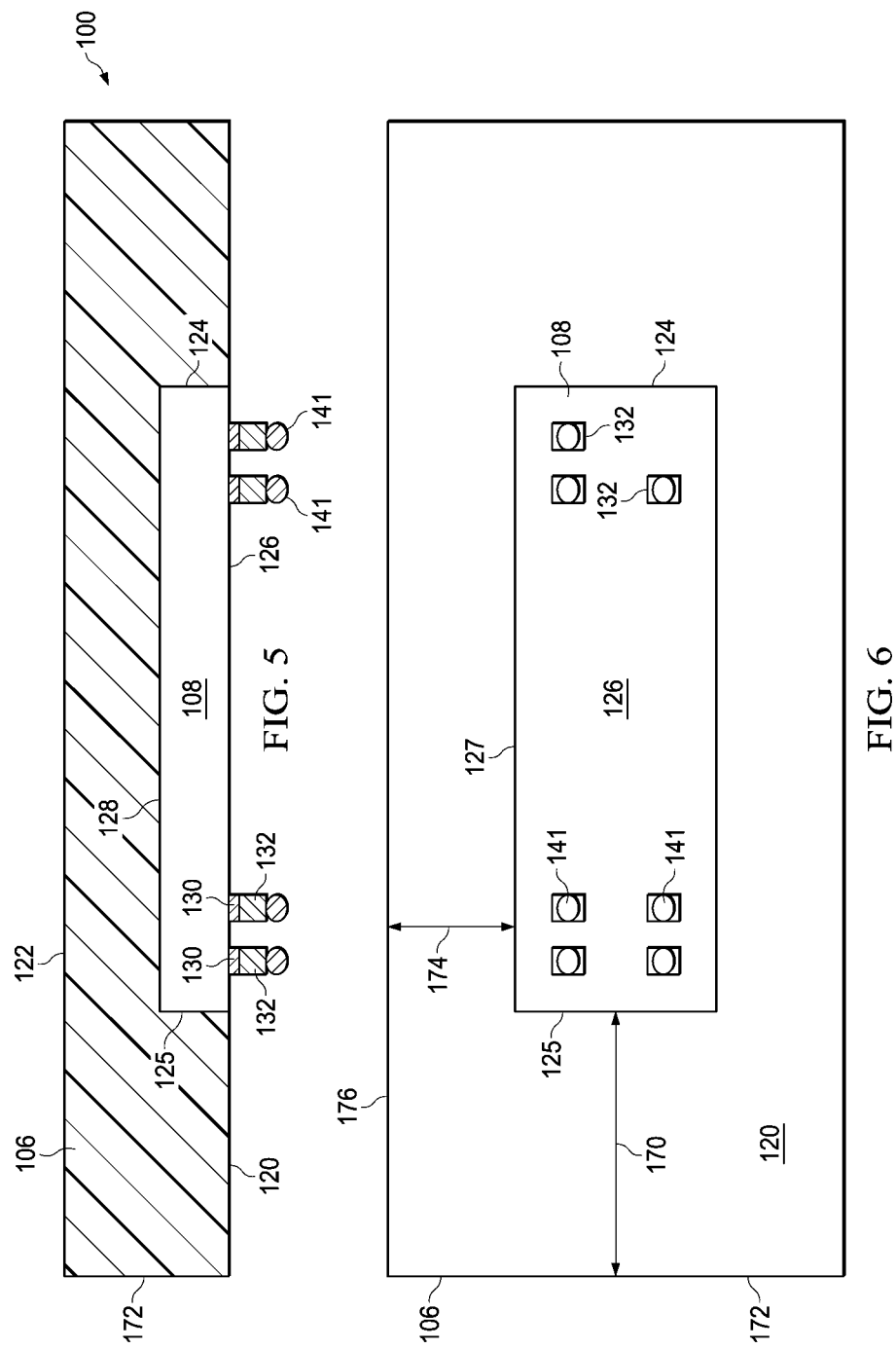

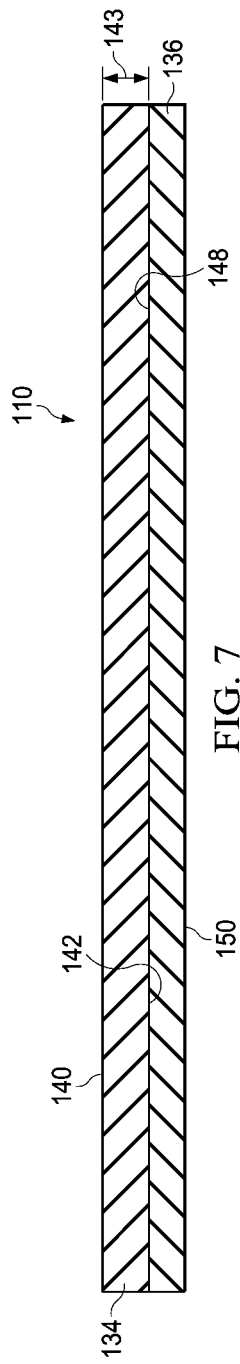
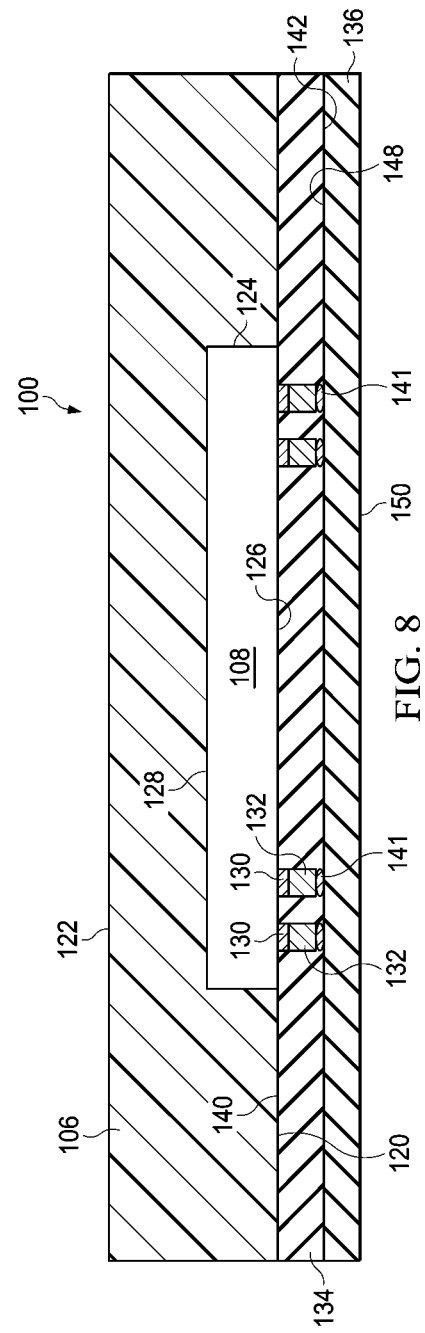
FIG. 7
FIG. 8

METHOD OF PACKAGING A CIRCUIT

CROSS REFERENCE TO RELATED APPLICATIONS

This application is a Divisional of and claims priority to U.S. patent application Ser. No. 13/563,345 filed on Jul. 31, 2012. Said application claims priority to U.S. provisional patent application 61/538,365 filed on Sep. 23, 2011 for PERMANENT CARRIER AND PACKAGE INTERCONNECT METHOD USING MOLD AND DISTRIBUTE APPROACH and U.S. provisional patent application 61/596,617 for INTEGRATED CIRCUIT AND METHOD OF MAKING filed on Feb. 8, 2012. Said application Ser. No. 13/563,345 is also a continuation-in-part of U.S. patent application Ser. No. 13/443,401 filed on Apr. 10, 2012 for INTEGRATED CIRCUIT AND METHOD OF MAKING and a continuation-in-part of U.S. patent application Ser. No. 13/481,275 filed on May 25, 2012 for INTEGRATED CIRCUIT AND METHOD OF MAKING. All applications are incorporated by reference in their entireties.

BACKGROUND

Conventional integrated circuits have a die, which is a small circuit, electrically and/or mechanically connected to a lead frame or other connection mechanism. The electrical connection between the die and the lead frame typically consists of wire bonds connected between conductive pads on the die and conductors on the lead frame. The wire bonds are very small and delicate such that a small force applied to a wire bond can damage it. Therefore, extreme care must be taken when handling a circuit having wire bonds connected thereto. In addition to being very delicate, the wire bonds take time to connect, so they add to the cost and manufacturing time of the integrated circuit.

Many high speed and high frequency circuit applications require short leads connecting a die to a lead frame. Short leads reduce the chance of the die encountering electromagnetic interference and they affect the parasitic inductance and capacitance associated with the leads. Wire bonds are relatively long and add to the parasitic capacitance and inductance of the connection between the die and the lead frame of an integrated circuit. Wire bonds are also susceptible to electromagnetic interference.

After a conventional die is connected to a lead frame, the integrated circuit is encapsulated with an encapsulant. The encapsulation process is typically the final or near the final stage of fabrication of the integrated circuit. The encapsulant prevents contaminants from interfering with the integrated circuit. For example, the encapsulant prevents moisture from contaminating the die. The encapsulant also prevents the wire bonds from being damaged. Until the integrated circuit is encapsulated, the die, wire bonds, and other components are subject to failure by contact with contaminants. It follows that great care must be taken during the fabrication process in order to prevent the integrated circuits from being damaged prior to encapsulation.

BRIEF DESCRIPTION OF THE DRAWINGS

FIG. 1 is a side, cutaway view of an embodiment of an integrated circuit.

FIG. 2 is an enlarged view of a portion of the printed wiring board of the circuit of FIG. 1 attached to the die.

FIG. 3 is an embodiment of a conductive stud used in the printed wiring board of FIG. 2.

FIG. 4 is a flow chart describing an embodiment of a method of fabricating the circuit of FIG. 1.

FIG. 5 is a side elevation view of the circuit of FIG. 1 in the process of being fabricated wherein the die therein has been encapsulated.

FIG. 6 is a bottom plan view of the circuit of FIG. 5.

FIG. 7 is a side elevation view of a first dielectric layer adhered to a conductive layer.

FIG. 8 is a side elevation view of the dielectric layer and the conductive layer of FIG. 7 affixed to the circuit of FIG. 5 wherein conductive studs on the die pierce the dielectric layer.

FIG. 13 is a flow chart describing another embodiment of fabricating the die of FIG. 1.

SUMMARY

Figure 9:
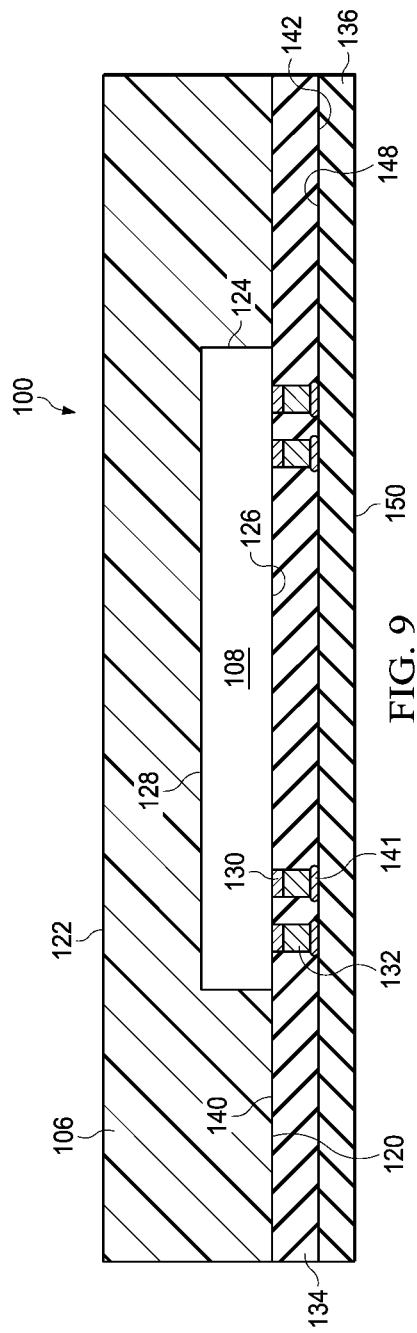
FIG. 9 is a side elevation view of the circuit of FIG. 8 with the conductive studs adhered to the conductive layer.

Circuits and methods of making circuits are disclosed herein. An embodiment of a circuit includes a die having a side. A conductive stud having a first end and an opposite second end is attached to the die, wherein the first end is connected to the side of the die and wherein the conductive stud extends from the side. A dielectric layer having a first side and a second side is attached to the side of the die, wherein the first side of the first dielectric layer is located proximate the side of the die so that the conductive stud extends into the dielectric layer from the first side. A conductive layer is located adjacent the second side of the dielectric layer and proximate the second end of the conductive stud. A conductive adhesive is adhered to the second side of the conductive stud and the conductive layer.

DETAILED DESCRIPTION

Integrated circuits (sometimes referred to herein simply as "circuits") and methods of making circuits are disclosed herein. FIG. 1 is a side, cutaway view of a circuit 100. The circuit 100 includes an encapsulant 106, a die 108, a printed wiring board 110, and a connection mechanism 112. Embodiments of methods for packaging the circuit 100 are described in greater detail further below.

The encapsulant 106 may be a conventional encapsulant commonly used to encapsulate integrated circuits or electronic devices. In some embodiments, the encapsulant 106 is applied by a transfer mold process. The encapsulant 106 has a first side 120 and a second side 122 located opposite the first side 120. A void 124 that is sized to receive the die 108, as described in greater detail below, is located in the first side 120. In many embodiments, the encapsulant 106 is molded around the die 108, so the void 124 is a recessed portion of the encapsulant 106 that is formed at the location of the die 108 during the encapsulation process.

The die 108 may be a conventional die that is commonly used in integrated circuits. The die 108 has a first side 126 and an opposite second side 128. The first side 126 of the die 108 forms a substantially continuous flat surface with the first side 120 of the encapsulant 106. Circuits and/or electronic devices (not shown) may be located in or on the die 108 in a conventional manner. For example, electronic devices may be fabricated on the second side 128. A plurality of conductive pads 130 may be located on the first side 126. The conductive pads 130 serve to electrically connect the die 108 to external devices or conductors. In some embodiments, the conductive pads 130 are contact points or the like that electrically and mechanically connect objects to the die 108. The conductive pads 130 may be very thin relative to other components of the circuit 100, however, for illustration purposes, they are shown as being substantially thick.

Conductive studs 132 are electrically and/or mechanically connected to the conductive pads 130. An enlarged view of a portion of the circuit 100 is shown in FIG. 2. The die 108 has a conductive stud 132 connected thereto, which is an example of all the conductive studs 132 of FIG. 1. The conductive stud 132 may be substantially similar to a copper pillar or a copper bump and may be fabricated by a copper bump process. The conductive stud 132 has a first end 133 that is closest to the die 108 and a second end 135 that is located opposite the first end 133. The conductive stud 132 has a height 137 measured from the first end 133 to the second end 135.

A second and similar embodiment of the attachment of the stud 132 to the die 108 is shown in FIG. 3. In the embodiment of FIG. 3, there is no conductive pad 130 located on the die 108. Rather, the conductive stud 132 in this embodiment is affixed directly to the die 108. For example, an under bump metal (not shown) may be applied to the die 108 to connect the stud 132 to the die 108. Alternatively, the conductive stud 132 may be a copper pillar similar or identical to those used in die and integrated circuit cooling. In the embodiment of FIG. 3, the stud 132 extends a distance 139 from the surface 126 of the die 108.

The second end 135 of the conductive stud 132 has a conductive adhesive 141 adhered thereto. The conductive adhesive 141 may be a solder ball similar to those commonly used in integrated circuit, including flip chip, fabrication. In the embodiments where the conductive adhesive 141 is solder, the solder may be in a solid state except during periods when the solder is heated to attached it to other components as described below.

The printed wiring board 110 is adhered to or fabricated to the first side 126 of the die 108 and may also be adhered to or fabricated to the first side 120 of the encapsulant 106. The printed wiring board 110 may contain several layers. In the embodiment of FIGS. 1-3, the printed wiring board 110 has three layers, a first dielectric layer 134, a conductive layer 136, and a second dielectric layer 138. The printed wiring board 110 may be fabricated separate from the circuit 100 and applied to the die 108 and the encapsulant 106 as a completed assembly. In other embodiments, the printed wiring board 110 is fabricated onto the die 108 and the encapsulant 106. Both fabrication methods are described below.

Referring to FIGS. 2 and 3, the first dielectric layer 134 has a first side 140 and a second side 142. The first side 140 is attached to or adhered to the first side 126 of the die 108, FIG. 1, and may also be attached to or adhered to the first side 120 of the encapsulant 106. The conductive layer 136 may be substantially similar to a redistribution layer in a die. The conductive layer 136 has a first side 148 and a second side 150, wherein the first side 148 is attached to or adhered to the second side 142 of the first dielectric layer 134. The conductive layer 136 includes conductive material 144, such as copper, that serves as traces and nonconductive material 146 that is located between the conductive traces. The conductive material 144 may be metal, such as a copper foil similar or identical to copper foil used in subtractive processing, or plated in semi-additive or full additive form. An example of a copper foil includes a one half to two ounce copper foil. In other embodiments, the conductive material 144 may be a foil having several layers, such as a copper/aluminum/copper foil. The nonconductive material 146 may be portions of either the first dielectric layer or the second dielectric layer 138.

The first side of the 148 of the conductive material 144 is adhered to the conductive adhesive 141. Accordingly, the first side 148 of the conductive material 144 and the conductive adhesive 141 are two materials that can bond or adhere to each other. Alternatively, the first side 148 of the conductive material 144 and the second side 135 of the conductive stud 132 are materials than can accept a common adhesive 141 or bonding material. In some embodiments, the first side 148 of the conductive material 144 is a copper material and the conductive adhesive 141 is solder. When solder is used as the conductive adhesive 141 and copper is used on the first side 148 of the conductive material 144, the solder is heated to a liquid state and flows into the copper of the conductive material 144 forming an electrical and mechanical connection.

The second dielectric layer 138 has a first side 152 and a second side 154, wherein the first side 152 is attached to or adhered to the second side 150 of the conductive layer 136. Both the first dielectric layer 134 and the second dielectric layer 138 may be insulating materials that are commonly used in circuits.

The printed wiring board 110 serves to electrically and/or mechanically connect the die 108 to the connection mechanism 112. In order to achieve the electrical connections, a plurality of traces and vias may be located within the printed wiring board 110 to electrically connect the die 108 to the connection mechanism 112.

As shown in FIGS. 1-3, the use of the conductive studs 132 and the conductive adhesive 141 enables electrical connections through the first dielectric layer 134 without the use of vias. Rather, electrical connections are completed between the die 108 and the conductive layer 136 by way of the conductive studs 132. The conductive adhesive 141 connects the conductive studs 132 directly to the conductive layer 136 without the use of vias. Accordingly, the fabrication of the connection between the die 108 and the conductive layer 136 is completed without using mechanical drilling, chemicals, or other processes to form via holes in or through the first dielectric layer 134, which could damage the die 108 or the first dielectric layer 134. In addition, plating and/or the like to form vias in the holes is not required.

The conductive layer 136 provides electrical conducting points at specific locations for the connection mechanism 112 by way of the conductive material 144. In the embodiment of FIGS. 1-3, vias 158 extend through the second dielectric layer 138 between the conductive layer 136 and the second side 154 of the second dielectric layer 138. It is noted that the connection mechanism 112 is electrically connected to the vias 158. Therefore, the connection mechanism 112 is electrically connected to the die 108.

The connection mechanism 112 may include a plurality of solder balls 160 that are electrically and mechanically connected to a plurality of conductors 162. The conductors 162 may be substantially similar to under bump metal layers used in semiconductor packaging. The conductors 162 are electrically connected to the vias 158. It follows that electrical connections extend between the solder balls 160 and the conductive pads 130 on the die 108. It is noted that the solder balls 160 and conductors 162 are examples of devices for connecting the vias 158 to external devices and that other devices, such as pins or wire bonds, may be used to electrically connect the vias 158 to external devices.

Having described the structure of the circuit 100, methods of packaging the circuit 100 will now be described. The packaging of the circuit 100 commences with encapsulating the die 108 as described at step 302 of the flow chart 300. The die 108 is a conventional circuit that is fabricated onto a wafer or substrate and may be similar to the type commonly used in integrated circuits. The die 108 may be a complete circuit meaning that no further circuit fabrication is required. However, the die 108 does need to be electrically connected to the connection mechanism 112 in order to power the die 108 and to send and receive signals as described below.

As described above, the die 108 has or is connected to conductive studs 132 that serve to electrically connect the die 108 to the conductive layer 136. The conductive adhesive 141 is applied to the second end 135 of the conductive studs 132. In some embodiments, the conductive adhesive 141 is solder balls commonly used in the packaging of flip chip devices and integrated circuit packages.

As previously mentioned, the conductive studs 132 may be substantially similar to copper bumps or copper pillars of the type that are conventionally used for cooling dies and integrated circuits. In other embodiments, the conductive studs 132 may be affixed to or fabricated onto the conductive pads 130 or other electrical contact points on the die 108 so as to be electrically and/or mechanically connected to the die 108. The conductive studs 132 may extend a distance 139, FIG. 3, from the surface 126 of the die 108. The length of the conductive stud 132 with the conductive adhesive 141 is sized so that the conductive adhesive 141 is able to adhere to the conductive layer 136 and the conductive layer 136 is able to bond or contact the first dielectric layer 134. In some embodiments, the distance 139 is equal to or slightly less than the thickness 143 of the first dielectric layer 134. In some embodiments, the first dielectric layer 134 has a thickness 143 of between ten and fifty microns. In such embodiments, the conductive studs 132 may extend a distance 139 of eight to forty-five microns from the surface 126 of the die 108.

The encapsulated die 108 is shown in FIG. 5, which is a side, cutaway, elevation view of the die 108 and the encapsulant 106. A bottom plan view of the encapsulated circuit 100 of FIG. 5 is shown in FIG. 6. The encapsulant 106 may be a conventional encapsulant used in the packaging of integrated circuits. In some embodiments, a transfer mold technique is used to encapsulate the die 108. Encapsulating the die 108 at this stage of packaging is unique. In conventional circuits, dies are not encapsulated until they are electrically connected to a connector or other connection device. For example, in flip-chip packaging, the encapsulation process does not occur until a printed wiring board has been attached to the die. By encapsulating the die 108 at this stage of packaging of the circuit 100, the die 108 may be handled or otherwise maneuvered with a lower probability of being damaged. The encapsulated die 108 is also less likely to become damaged by contaminants.

In the embodiments described herein, the entire die 108 except for the first side 126 is encapsulated. By encapsulating the die 108, except for the first side 126, at this point during packaging, the die 108 is protected and the conductive studs 132 are accessible in order to connect the conductive layer 136 to the die 108. As shown in FIGS. 5 and 6, the encapsulant 106 may extend laterally beyond the edges 125, 127 of the die 108, which enables the completed circuit 100 to fit snugly into larger packages. A first edge 172 of the encapsulant and a first edge 125 of the die 108 are spaced apart a distance 170. A second edge 176 of the encapsulant 106 and a second edge 127 of the die 108 are separated by a distance 174 as shown in FIG. 6. The distances 170, 174 determine the size of the first side 120 of the encapsulant 106, which may be substantially planar. The die 108 may be located in the encapsulant 106 in such a manner that the first side 126 of the die 108 and the first side 120 of the encapsulant 106 form a substantially planar and continuous surface.

The encapsulant 106 may be applied to the die 108 by different methods. For example, a liquid encapsulant may be molded over the die 108 and cured in a conventional manner. In other embodiments, a solid encapsulant may be formed with the void 124 located therein. The die 108 may be secured within the void 124 so that the die 108 is effectively encapsulated by the encapsulant 106. In yet other embodiments, the encapsulant 106 is cured simultaneously with the curing of the printed wiring board 110 or components in the printed wiring board 110. In such embodiments, the encapsulant 106 may be cured to a stage-B or gel state at this stage of packaging. After the printed wiring board 110 is attached to the die 108 and the encapsulant 106, the encapsulant 106 and components in the printed wiring board 110 may then be cured simultaneously. The simultaneous curing may enhance the bond between the printed wiring board 110 and the encapsulant 106. For example, the encapsulant 106 and the first dielectric layer 134 are able to flow together in their gel state and then fully cure together. In yet another embodiment, the solder balls 141 are heated during the curing of the encapsulant so that they flow into the conductive layer 136. This embodiment accomplishes the curing of the encapsulant and the connection of the conductive studs 132 to the conductive layer 136 in a single step.

Several different embodiments of applying the printed wiring board 110 to the die 108 will be described below. It is noted that the printed wiring board 110 replaces conventional wire bonds. Therefore, none of the embodiments of the circuit 100 described herein require wire bonds or the like between the die 108 and the connection mechanism 112. Accordingly, all the embodiments of the printed wiring board 110 enable very short distances between the die 108 and the connection mechanism 112, which reduces the parasitic capacitance and inductance associated with the electrical connection between the die 108 and the connection mechanism 112.

A first embodiment of applying the printed wiring board 110 to the circuit 100 commences with applying the first dielectric layer 134 to the first side 148 of the conductive layer 136 as described in step 304 of the flow chart and as shown in FIG. 7. More specifically, the first dielectric layer 134 is adhered to the first side 148 of the conductive layer 136. The first dielectric layer 134 may be laminated to the conductive layer 136 by a conventional low temperature vacuum lamination process. The first dielectric layer 134 may be a non-fibrous dielectric material, such as an Ajinomoto build-up film (ABF), produced by Ajinomoto Fine-Techno Co, Inc of Japan and Ajinomoto North America, Inc. of Fort Lee, N.J., USA. The first dielectric layer 134 may have a thickness 143 of between ten and fifty microns. The material used in the first dielectric layer 134 may have a low viscosity prior to being cured. In order to keep the first dielectric layer 134 from sliding off the conductive layer 136 when it is in a state having a low viscosity, the first dielectric layer 134 may be cured to a B-stage wherein the first dielectric layer 134 has the viscosity of a gel. Such a curing enables the first dielectric layer 134 to be transported by way of the conductive layer and be adhered to the encapsulant 105 and die 108 as described below.

The conductive layer 136 may be a metal, such as a copper foil. In some embodiments, the conductive layer 136 is a one half to two ounce copper foil. In other embodiments, the conductive layer 136 may be a foil having several layers, such as a copper/aluminum/copper foil. The conductive layer 136 is used to apply the first dielectric layer 134 to the encapsulant 106 and the die 108 by forming a rigid carrier to support the first dielectric layer 134 so that it can be pressed against the encapsulant 106 and the die 108.

At this stage of packaging, the first dielectric layer 134 is adhered to the conductive layer 136. The first dielectric layer 134 may then be transported or handled by using the conductive layer 136, which reduces the likelihood of damage to the first dielectric layer 134 during handling. The gel state of the first dielectric layer 134 enables it to be applied to the circuit 100 as described at step 306 of the flow chart 300, which yields the circuit 100 as shown in FIG. 8. Application of the first dielectric layer 134 to the die 108 may be accomplished by pressing the first dielectric layer 134 with the attached conductive layer 136 onto the die 108. It is noted that in some embodiments, a large sheet of a first dielectric layer is adhered to a plurality of dies, which are singulated during a later stage of packaging. As the first dielectric layer 134 and the conductive layer 136 are pressed onto the die 108, the conductive studs 132 pierce the first dielectric layer 134. In some embodiments, the conductive studs 132 pierce the first dielectric layer 134 to a distance that is proximate or contacting the first side 148 conductive layer 136.

The circuit 100 may be heated to cause the conductive adhesive 141 to flow or bond to the first side 148 of the conductive layer 136 as described in step 308 of the flow chart 300 and as shown in FIG. 9. For example, if the conductive adhesive 141 is solder, the circuit 100 may be heated, or the conductive layer 136 may be heated, to a temperature that causes the solder to flow into the first side 148 of the conductive layer 136.

The first dielectric layer 134 and the encapsulant 106 may be cured simultaneously as described at step 310 of the flow chart 300. The partially cured jell state of the first dielectric layer 134 enables it to be easily bonded to or located adjacent the die 108 and the encapsulant 106 and reduces or eliminates the potential for voids between the surfaces. More specifically, if the encapsulant 106 is in a jell state, first dielectric layer 134 and the encapsulant 106 may flow together for better bonding. The bonding may be accomplished by applying heat to the circuit 100. In some embodiments, the circuit 100 is heated to cause the conductive adhesive 141 to bond to the conductive layer 136 while simultaneously curing the first dielectric layer 134 and the encapsulant 106.

The circuit 100 at this point in the packaging process has the first dielectric layer 134 and the encapsulant 108 cured. The first dielectric layer 134 is adhered to the die 108 and/or the encapsulant 108. The process of packaging the circuit 100 proceeds to step 312 of the flow chart 300 where the conductive layer 136 is etched to form traces similar or identical to a redistribution layer. The etching may be performed by a conventional etching process. The resulting circuit 100 is shown in FIG. 10.

Figure 10:
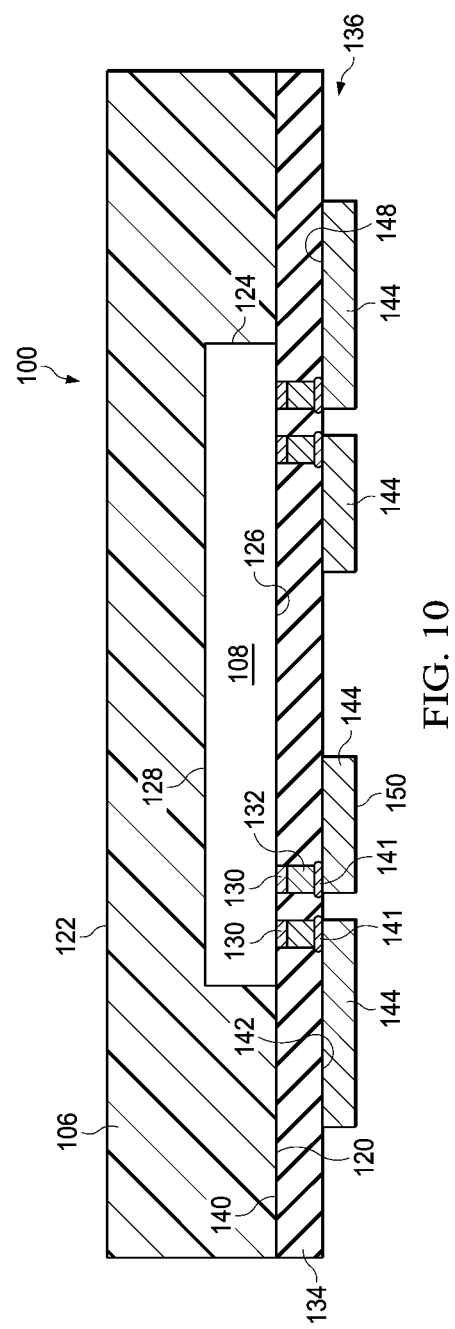
FIG. 10 is a side elevation view of the circuit of FIG. 9 with the conductive layer etched.

As shown in FIG. 10, no vias are required to be formed between the die 108 and the conductive layer 136. Rather, the conductive studs 132 that are connected between the die 108 and the conductive layer 136 serve as vias, but they do not require holes to be formed through the first dielectric layer 134. It has been found that the process of forming holes in a layer in close proximity to the die 108 may damage the die 108.

In some embodiments, the circuit 100 as shown in FIG. 10 is complete. The circuit 100 is functional and may be connected to other devices by way of the printed wiring board 110. For example conductors may be connected to the second side 150 of the conductive layer 136 in order to electrically connect the circuit 100 to other components.

Figure 11:
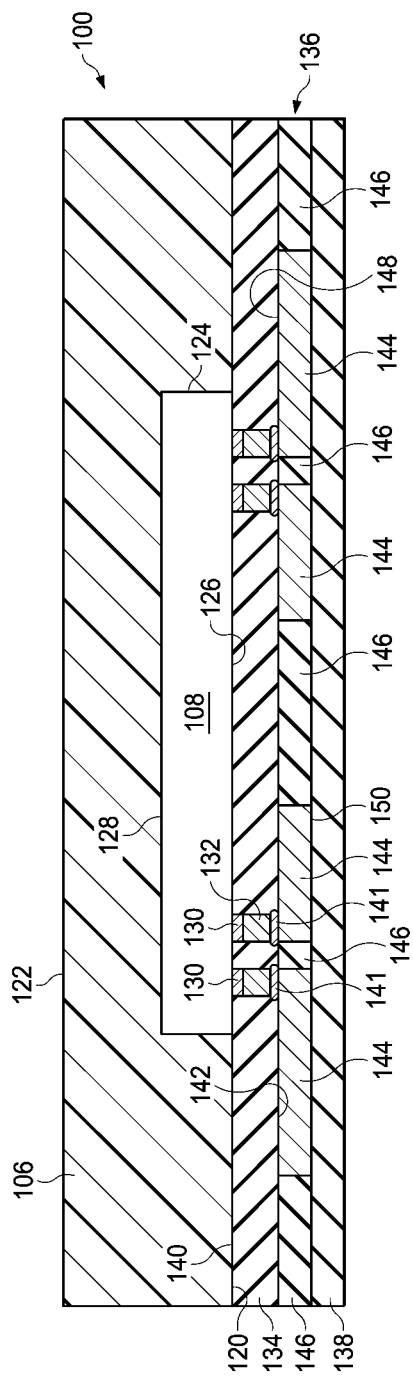
FIG. 11 is a side elevation view of the circuit of FIG. 10 with the addition of a second dielectric layer.

In other embodiments of the circuit 100, the second dielectric layer 138 is affixed to the conductive layer 136 as described in step 314 of the flow chart 300 and as shown in FIG. 11. As described above, the second dielectric layer 138 has a first side 152 and a second side 154, wherein the first side 152 is adhered to or attached to the conductive layer 136. The second dielectric layer 138 may be substantially the same material as the first dielectric layer 134. The second dielectric layer 138 serves to protect the conductive layer 136 from damage during handling and from debris or other matter that may short or otherwise damage the conductive layer 134. In addition, the second dielectric layer 138 serves to support the connection mechanism 112.

Figure 12:
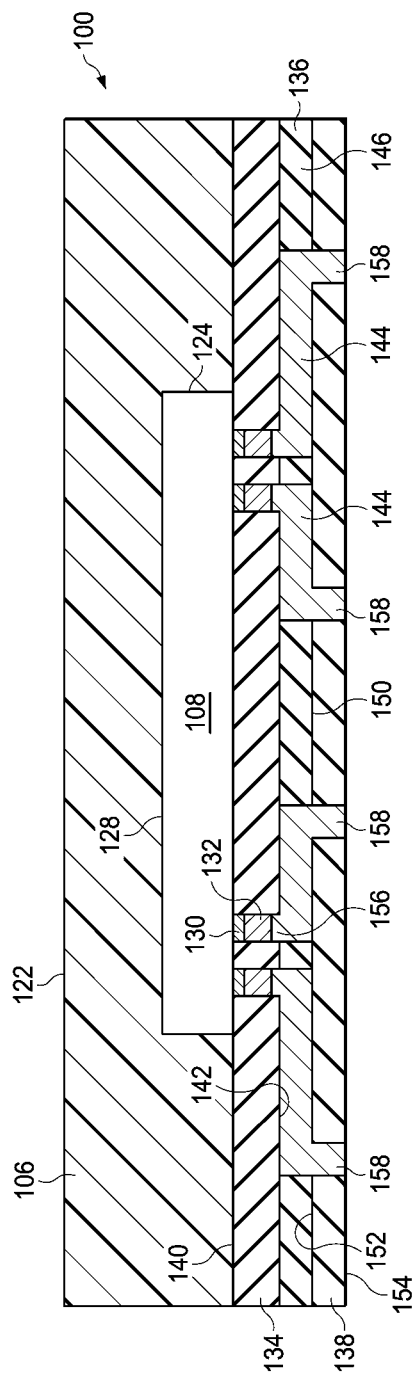
FIG. 12 is a side elevation view of the circuit of FIG. 11 with vias formed through the second dielectric layer.

The vias 158 are formed in the second dielectric layer 138 as described in step 316 of the flow chart 300 and as shown in FIG. 12. The vias 158 extend between the first side 152 and the second side 154 of the second dielectric layer 138. The vias 158 are fabricated by forming holes through the second dielectric layer 138 wherein the holes contact specific portions of the conductive material 144 of the conductive layer 136. The holes may be formed in the same way as the holes that are formed in the first dielectric layer 134 to fabricate the vias 156. Likewise, the holes may be filled with or plated with a conductive material to form the vias 158.

The circuit 100 now has an encapsulated die 108 with electrical connections between the die 108 and the second side 154 of the second dielectric material 138. The connection mechanism 112 may now be affixed to the second side 154 of the second dielectric material 138 as described in step 318 of the flow chart 300 and as shown in FIG. 1. The connection mechanism 112 electrically and/or mechanically connects the circuit 100 to other devices. For example, the connection mechanism 112 may provide input and output signals to and from the die 108. The connection mechanism 112 may also enable the circuit 100 to be physically attached to a substrate (not shown), such as a printed circuit board, or other physical structure.

As briefly described above, the connection mechanism 112 may include a plurality of conductors 162 that are attached to the second side 154 of the second dielectric layer 138. The conductors 162 are electrically connected to the vias 158 in order to provide electrical connections to the die 108. The conductors 162 may be conventional metal layers, such as under bump metal layers that are commonly used to support solder balls 160. The solder balls 160 may be attached to the conductors 162 in a conventional manner.

The circuit 100 has many advantages over conventional integrated circuits. For example, the circuit 100 was encapsulated early in the production process. Therefore, the circuit 100 may be handled and maneuvered with a lower probability of becoming damaged during the remaining production processes. In addition, the circuit 100 is less susceptible to damage from contaminants during production.

The die 108 of the circuit 100 is less likely to be damaged by the formation of vias extending to the die 108 as are required in conventional circuit. As described above, no holes are required to be formed in the first dielectric layer 134. Instead of holes and vias, the conductive studs 132 connect the die 108 directly to the conductive layer 136. Therefore, the time required to package the circuit 100 is reduced by not having to form the vias. In addition, the conductive adhesive 141 can be cured to the first side 148 of the conductive layer 136 simultaneous to the curing of the first dielectric layer 134 and the encapsulant 106.

Electrically, the circuit 100 has many benefits over conventional integrated circuits. The circuit 100 does not require any wire bonds. Therefore, the circuit 100 is not subject to the increased parasitic capacitance or inductance associated with wire bonds. In addition, the conductive layer 136 enables the lead lengths between the conductive pads 130 on the die 108 and the connection mechanism 112 to be very short. The short distance reduces the electromagnetic interference that the circuit 100 is subject to. It follows that the circuit 100 is better suited to operate in high frequency, high speed, and low power applications.

Having described some embodiments of packaging the circuit 100, other embodiments, will now be described. In some embodiments, the first dielectric layer 134 is applied directly to the die 108 and the encapsulant 106 without the use of the conductive layer 136, FIG. 7. In such an application, the circuit 100 may be positioned so that the first side 120 of the encapsulant 106 and the first side 126 of the die 108 are facing up. The first dielectric layer 134 may then be applied to the first surface 120 of the encapsulant 106 and the first surface 126 of the die 108. The first dielectric layer 134 may then be cured wherein the curing may also simultaneously cure the encapsulant 106. In this embodiment, the first dielectric layer 134 is fabricated onto the die 108 with the conductive studs 132 located proximate the second side 142 of the first dielectric layer 134. The conductive adhesive 141 may be applied to the second sides 135 of the conductive studs 132 at this time. Packaging of the circuit 100 may continue by applying the conductive layer 136 to the second side 142 of the first dielectric layer 134 so that the first side 148 of the conductive layer 136 bonds to the conductive adhesive 141.

In another embodiment of the packaging process, the conductive adhesive 141 is located on the first side 148 of the conductive layer 136. The conductive studs 132 are forced into the conductive adhesive 141 as the conductive layer 136 is placed onto the first dielectric layer 134.

In other embodiments, heat spreaders are used in conjunction with or as an alternative to the encapsulant 106. For example, the die 108 may be located in a heat spreader prior to encapsulation. Alternatively, the die 108 may be located in a heat spreader in lieu of encapsulation.

It will be appreciated from the above description that a method of packaging a circuit may comprise the method set forth in the flow chart 400 of FIG. 13 with additional reference to FIG. 1. The method commences at step 402 with providing a die 108 wherein the die 108 has a side 126. The method continues at step 404 with connecting a conductive stud 132 to the side 126 of the die 108, wherein the conductive stud 132 has a first end 133 that is connected to the die 108 and an opposite second end 135. At step 406 a first dielectric layer 134 is affixed to the side 126 of the die 108, the first dielectric layer 134 having a first side 140 and a second side 142, wherein the first side 140 of the first dielectric layer 134 is affixed to the side 126 of the die 108, and wherein the conductive stud 132 enters the first side 140 of the first dielectric layer 134. At step 408 a conductive layer 136 is affixed to the second side 142 of the first dielectric layer 134. The method concludes at step 410 with adhering the second side 135 of the conductive stud 132 to the conductive layer 136 using a conductive adhesive 141.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for packaging an integrated circuit (IC), comprising:
   encapsulating a die having a side, with an encapsulant, except for the side;
   connecting a first end of a conductive stud to the side;
   affixing a conductive adhesive on an opposite second end of the conductive stud; and
   simultaneously affixing a first dielectric layer to the side of the die and to a portion of the encapsulant, a sum of heights of the conductive stud and the conductive adhesive being less than or approximately equal to a height of the first dielectric layer.

2. The method of claim 1 further comprising:
   affixing a conductive layer to the conductive adhesive; and
   affixing a second dielectric layer to the first dielectric layer, the second dielectric layer encompassing the conductive layer.

3. The method of claim 1, wherein affixing a first dielectric layer comprises affixing a partially cured first dielectric layer.

4. The method of claim 1, wherein encapsulating the die with the encapsulant comprises encapsulating the die with a partially cured encapsulant.

5. The method of claim 2 further comprising electrically connecting solder balls to a set of vias in the second dielectric layer.

6. The method of claim 2 further comprising curing the encapsulant and the first dielectric layer.

7. The method of claim 2 further comprising curing the encapsulant and the first dielectric layer simultaneously.

8. The method of claim 1, wherein attaching a conductive stud to the side comprises:
   attaching a conductive pad to the side; and
   attaching the conductive stud to the conductive pad.

9. The method of claim 8, wherein sum of heights of the conductive stud, the conductive adhesive, and the conductive pad is less than or approximately equal to the height of the first dielectric layer.

10. The method of claim 1, wherein the height of the first dielectric layer is in between 10 and 50 microns.

11. The method of claim 1, wherein the height of the conductive stud is in between 10 and 50 microns.

12. A method for packaging an integrated circuit (IC), comprising:
   encapsulating a die having a side, with an encapsulant, except for the side;
   electrically connecting a first end of a conductive stud to the die;
   affixing solder on an opposite second end of the conductive stud; and
   simultaneously affixing a first dielectric layer to the side of the die and to a portion of the encapsulant, a sum of heights of the solder and the conductive stud being less than or approximately equal to a height of the first dielectric layer.

13. The method of claim 12 further comprising:
   affixing a conductive layer to the solder; and affixing a second dielectric layer to the first dielectric layer, the second dielectric layer encompassing the conductive layer.

14. The method of claim 13 further comprising electrically connecting solder balls to the conductive layer.

15. The method of claim 12, wherein the first dielectric layer is a non-fibrous dielectric material.

16. The method of claim 13, wherein the conductive layer is a metal foil.

17. A method for packaging an integrated circuit (IC), comprising:
    encapsulating a die having a side, with an encapsulant, except for the side;
    affixing a conductive pad to the side;
    connecting a first end of a conductive stud to the conductive pad;
    affixing conductive adhesive on an opposite second end of the conductive stud;
    simultaneously affixing a first dielectric layer to the side of the die and to a portion of the encapsulant, a sum of heights of the conductive pad, the conductive stud, the conductive adhesive being less than or approximately equal to a height of the first dielectric layer;
    affixing a conductive layer to the conductive adhesive; and
    affixing a second dielectric layer to the first dielectric layer, the second dielectric layer encompassing the conductive layer.

* * * * *